United States Patent
Cheng et al.

(10) Patent No.: US 6,717,220 B2
(45) Date of Patent: Apr. 6, 2004

(54) TUNABLE THRESHOLD VOLTAGE OF A THICK FIELD OXIDE ESD PROTECTION DEVICE WITH A N-FIELD IMPLANT

(75) Inventors: Tao Cheng, Kangshang (TW); Jyh-Cheng You, Chiao-shi (TW); Lin-June Wu, Hsin-Chu (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 30 days.

(21) Appl. No.: 10/236,534

(22) Filed: Sep. 6, 2002

(65) Prior Publication Data

US 2003/0017673 A1 Jan. 23, 2003

Related U.S. Application Data

(62) Division of application No. 09/863,222, filed on May 24, 2001, now Pat. No. 6,465,308.

(51) Int. Cl.[7] ............................... H01L 23/62; H01L 29/06
(52) U.S. Cl. ............................. 257/360; 257/20; 257/24; 257/27; 257/192; 257/197; 257/173; 257/355
(58) Field of Search .................... 257/339, 343, 257/344, 372, 373, 374, 375–376, 314, 315, 396, 398, 399, 409, 355, 360, 356, 361, 362, 367; 438/289, 381, 447, 241; 361/56, 91.1

(56) References Cited

U.S. PATENT DOCUMENTS

| | | | |
|---|---|---|---|
| 4,760,433 A | 7/1988 | Young et al. ............ 357/23.13 |
| 5,707,886 A | 1/1998 | Consiglio et al. ............. 437/52 |
| 5,744,841 A | * 4/1998 | Gilbert et al. ............... 257/360 |
| 5,869,366 A | 2/1999 | Honnigford et al. ........ 438/200 |
| 5,894,153 A | 4/1999 | Walker et al. ............... 257/355 |
| 5,960,290 A | * 9/1999 | Hsu ........................... 438/281 |

OTHER PUBLICATIONS

Chen et al., "Design Methodology for Optimizing Gate Driven ESD Protection Circuits in Submicron CMOS Processes," EOS/ESD Symposium, 1997 Proceedings, pp. 230–239.

Chen, "The Effects of Interconnect Process and Snapback Voltage on the ESD Failure Threshold of NMOS Transistors," IEEE Trans. Electron Devices, vol. 35, No. 12, pp. 2140–2150.

* cited by examiner

Primary Examiner—Minhloan Tran
Assistant Examiner—Tan Tran
(74) Attorney, Agent, or Firm—George O. Saile; Stephen B. Ackerman

(57) ABSTRACT

A structure and a process for manufacturing semiconductor devices with improved ESD protection for high voltage applications is described. A thick field gate oxide N channel field effect transistor (FET) device with a tunable threshold voltage (Vt) is developed at the input/output to the internal active circuits for the purpose of providing ESD protection for applications in the 9 volt and higher range. The FET threshold voltage determines the ESD protection characteristics. A N-field implant is used to provide a dopant region under the thick oxide gate element which has the effect of modifying the threshold voltage (Vt) of this device enabling the device turn-on to be "tuned" to more closely match the application requirements of the internal semiconductor circuits. The gate electrical contact is completed by using either a metal gate electrode or polysilicon gate element. The gate and drain of the thick oxide FET device are connected to the input/output connection pad of the internal semiconductor circuits which also enhances ESD protection. The FET source element is connected to another voltage source, typically ground, providing a path to shunt the current from an ESD incident thereby protecting the internal circuitry from damage.

15 Claims, 4 Drawing Sheets

FIG. 1A – Prior Art

TUNABLE THRESHOLD VOLTAGE OF A THICK FIELD OXIDE ESD PROTECTION DEVICE WITH A N-FIELD IMPLANT

This is a division of patent application Ser. No. 09/863,222, filing date May 24, 2001 now U.S. Pat. No. 6,465,308. A Tunable Threshold Voltage Of A Thick Field Oxide Fsd Protection Device With A N-Field Implant, assigned to the same assignee as the present invention.

BACKGROUND OF THE INVENTION

(1) Field of the Invention

The present invention relates generally to the structure and manufacturing process of a FET semiconductor device ESD protection of electronic circuit devices and more particularly to a tunable threshold voltage thick held oxide device with improved ESD circuit protection characteristics for higher voltage applications.

(2) Description of Prior Art

Because of high input impedance and thin oxide gate structures, the problem of electrostatic discharge damage (ESD) with field effect transistor (FET) devices can be severe. Therefore the input/output (I/O) circuit locations or pads usually have a protective device connected between the I/O pad and the internal circuits as shown in FIG. 1A, which allows the ESD current to be shunted to ground. In the prior art, for circuit applications in the range of 5 volts, an active device thin oxide gate field effect transistor is often used as shown in FIG. 1A. With the prior art method, the FET source and gate are tied to ground and the drain is connected to the input/output terminal which serves as the I/O to the internal logic circuits 20. It is important to note that in this prior art configuration, the FET gate is tied to a second voltage source, typically ground. Also depicted in FIG. 1A is a parasitic non bipolar transistor 14, formed from the parasitic elements of the FET source and drain and the substrate.

The protection mechanism is initiated by a threshold trigger voltage as shown in FIG. 1B whereby the ESD current is shunted primarily through the parasitic bipolar by a breakdown characteristic. For logic voltage applications of 5 volts, this trigger voltage level is typically in the 10 to 15 volt range which is generally adequate to protect the internal logic circuits from damage. After current flow initiated by Vt, there results a snapback characteristic to Vsp. The region from Vsp to Vtt is known as the clamping region whereby the ESD current is shunted to ground. Beyond Vtt damage to the protection device structure can occur.

Another important characteristic of the ESD protection device is that it must not interfere with the operation of the devices it is designed to protect, while at the same time providing good protection when abnormal or ESD voltage incidents occur. However, in the 9 volt to 16 volt application range, sometimes referred to as high voltage application range, the design and processing of the active thin gate FET device to enable it to be compatible with the higher voltage can result in a trigger voltage point of 22 volts or greater, that is often higher than desired for the application. It is also highly desirable to be able to control or set the initiation or trigger point of the ESD protection device to match the application requirements as closely as possible. The invention provides a novel and unique structure that provides a degree of control of the trigger point for the protection device used for the higher voltage applications.

U.S. Pat. No. 4,760,433 issued to Young et at., describes an electrostatic discharge (ESD) protection circuit including complementary bipolar transistors having collectors connected to an input and base and emitters connected together to a respective voltage source. The bipolar transistors are lateral transistors having a field plate over the base region and spaced laterally from the laterally spaced collector and emitter regions. The base may include increased impurity surface regions extending from the emitter and collector to the gate to increase the beta and decrease the collector base breakdown.

U.S. Pat. No. 5,707,886 to Consiglio et al., illustrates an integrated circuit structure with input/output gate voltage regulation and parasitic zener and junction diodes for protection against damage resulting from ESD events.

U.S. Pat. No. 5,869,366 issued to Honnigford et al., teaches an IC voltage clamp and a process for forming the voltage clamp. The voltage clamp includes a metal gate field oxide device having an n-type source region, an n-type drain region, and a p-type held implant diffusion between the source and drain regions. Overlapping their masks form the field implant diffusion and drain/collector regions, such that a lower breakdown voltage is achieved between the NPN collector and the substrate and field implant the NPN base).

U.S. Pat. No. 5,894,153 issued to Walker et al., describes an integrated circuit protected by an SCR that conducts electrostatic discharge pulses from the pad directly to a current sink. The SCR includes a subregion underneath a held oxide that has a field implant that increases the dopant concentration. The field implant lowers the SCR trigger voltage, so that the SCR triggers before an ESD pulse can cause latch-up or damage in other devices in the integrated circuit.

The following technical reports also refer to the subject of ESD protection in MOS circuits;

"Design Methodology for Optimizing Gate driven ESD Protection Circuits in Submicron CMOS Processes", by Chen el al., EOS/ESD Symposium, 1997 Proceedings Pages 230–239.

"The Effects of Interconnect Process and Snapback Voltage on the ESD Failure Threshold of NMOS Transistors", by Chen et al., IEEE Transactions Electron Devices vol. 35, no. 12, pp. 2140–2150.

SUMMARY OF THE INVENTION

Accordingly, it is the primary objective of the invention to provide an effective and manufacturable method and structure for improving high voltage application semiconductor device resistance to the potential damage caused by the phenomenon known as electrostatic discharge (ESD) by utilizing a thick field oxide field effect transistor (FET) connected to an input/output pad of an integrated circuit device.

It is a further objective of the invention to improve ESD protection by providing a tunable or adjustable threshold voltage (Vt) of the thick field oxide FET device by using an N-field implant during device processing.

Another objective of the invention is to provide a capability to reduce the threshold of the thick field oxide FET ESD protection device, and hence improving ESD protection, without unduly reducing the thickness of the thick field oxide which essentially forms the gate oxide for the FET protection device.

A still additional objective of the invention is to provide the improved ESD protection without changing the characteristics of the internal circuits being protected and by using a process compatible with the process of integrated MOS device manufacturing.

The above objectives are achieved in accordance with the methods of the invention which describes a structure and a process for manufacturing semiconductor devices with improved ESD protection. A thick gate oxide field effect transistor (FET) device with a tunable threshold voltage (Vt) is developed at the input to the internal circuits to achieve this ESD protection. Thick field oxide regions similar to those used for FET device isolation areas are formed on a semiconductor substrate and appropriate dopants are used to form source/drain regions in proximity to and on either side of the thick field oxide gate element essentially forming a thick oxide N channel metal oxide semiconductor field effect transistor (NMOSFET) with an associated parasitic non bipolar transistor. A field implant is used to provide a dopant region under the thick oxide gate element. This has the effect of modifying the threshold voltage (Vt) of this device enabling the device turn-on to be "tuned" to more closely match the application requirements of the internal chip active semiconductor circuits. The thick oxide field protection device is particularly beneficial for voltage applications of 9 volts and above. The gate and drain of the thick oxide FET device and the collector of the parasitic non bipolar transistor are connected to the input connection pad of the internal semiconductor circuits. This configuration enhances sensitivity to ESD events. The FET source and the emitter and base of the parasitic bipolar transistor are connected to a second voltage source, typically ground, providing a path to shunt the current from an ESD incident thereby protecting the internal circuitry from damage from an ESD event. The primary ESD current shunt path is through the thick gate oxide FET.

BRIEF DESCRIPTION OF THE DRAWINGS

FIG. 1A shows an equivalent circuit diagram of a prior art thin gate oxide active FET device and its associated parasitic lateral bipolar transistor.

DESCRIPTION OF THE PREFERRED EMBODIMENTS

Figure 1B:
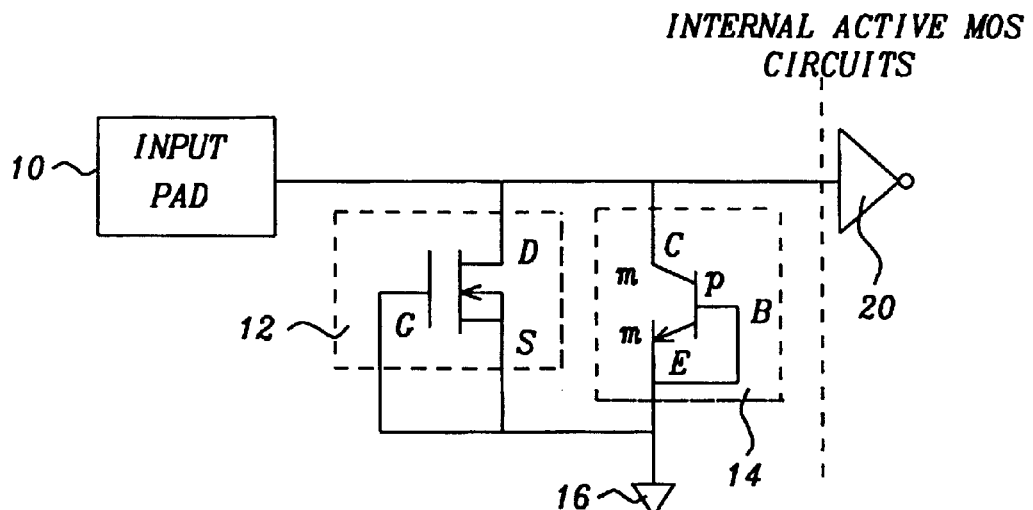
FIG. 1B represents the typical current (I) vs. voltage (V) characteristic for the prior art NMOS and the associated parasitic bipolar transistor showing threshold trigger voltage and the snapback voltage clamping region.
Figure 1B:
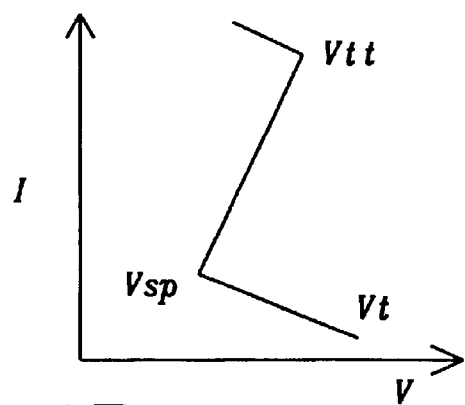
Figure 2:
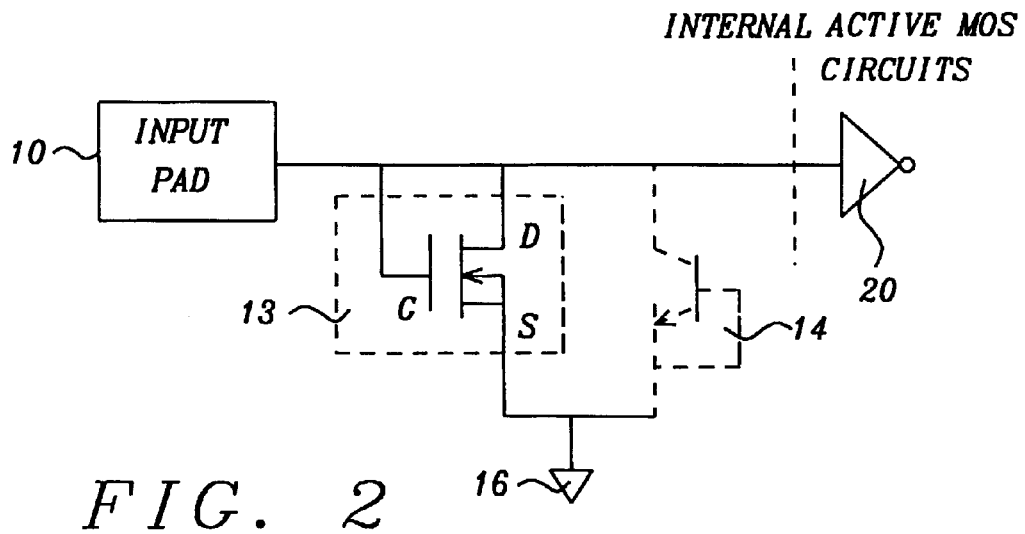
FIG. 2 shows the equivalent circuit of the invention thick gate oxide FET and associated parasitic non bipolar transistor used for ESD protection in high voltage applications.

FIG. 2 depicts the electrical circuit for the invention thick oxide held N channel field effect transistor (NFET) ESD protection device 13 and the associated lateral npn parasitic bipolar transistor 14 that is electrically in parallel with it. The bipolar base, emitter and NFET source are electrically tied together and to a second voltage source 16, typically ground. The parasitic bipolar transistor 14 collector and NFET 13 gate and drain are electrically tied together and connected to the input pad 10 of the internal active MOS circuits 20. An ESD pulse at the input pad 10 will trigger the thick field FET 13 which is the primary protection element for the high voltage application. Typically the threshold trigger voltage for the thick field oxide FET 13 will be in the range of 12 to 22 volts, which is very desirable for high voltage applications in the 9 to 16 volt range. Another advantage of tailoring the trigger voltage more precisely to the application requirements is that generally, a reduction in the FET threshold trigger voltage will also result in an enhanced ESD pass voltage characteristic further improving the level of ESD protection.

Figure 3:
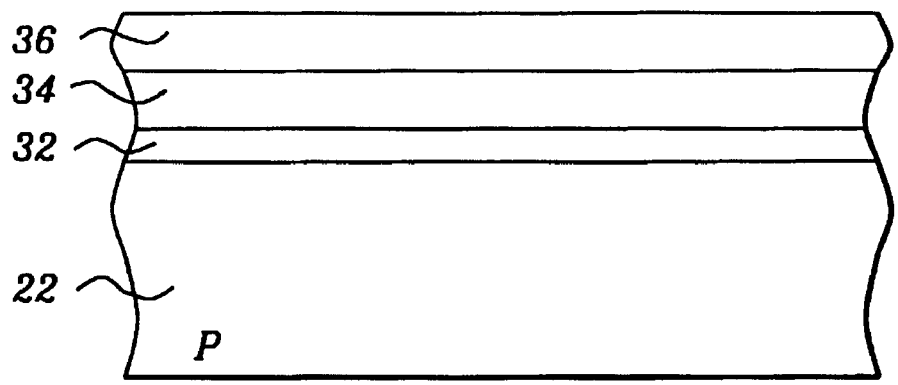
FIG. 3 is a cross section of a semiconductor device showing the substrate covered with a pad oxide and silicon nitride layer prior to being patterned.
Figure 4A:
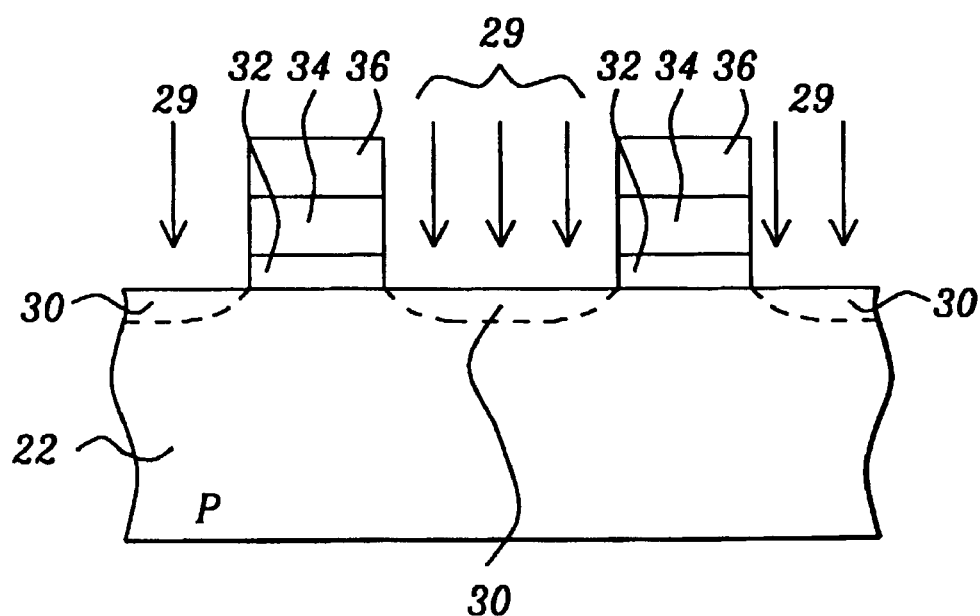
FIG. 4A is a cross section view of a semiconductor device during a N field implant after patterning and pad oxide and SiN etching to define the field oxide regions.

Referring to FIG. 3 a suitable substrate 22, typically of monocrystalline silicon, with P type doping, is used as the basis for the device. During normal device processing a pad oxide layer 32 is grown on the substrate surface and a silicon nitride ($Si_3N_4$) layer 34 is deposited over this layer of pad oxide in preparation for the field oxide patterning. A layer of photoresist 36 is placed on the $Si_3N_4$ 34 and patterned to determine the location of the field or thick oxide. FIG. 4A depicts the substrate 22 patterned with photo resist 36 after the pad oxide 32, and $Si_3N_4$ 34 have been etched to define the field oxide regions. At this time a N= field implant 29 is performed typically using phosphorous (P)) with a dopant density of 1 E12 to 1 E13 atoms/$cm^2$ (a/$cm^2$), and with an implant energy of between 60 KeV to 140 KeV to produce a N field region 30 with dopant concentration of between 4 E13 and 6 E13 atoms/cm3 (a/$cm^2$). This field implant doping 30 allows for the changing or tuning of the thick field FET protection device threshold voltage (Vt).

Figure 4B:
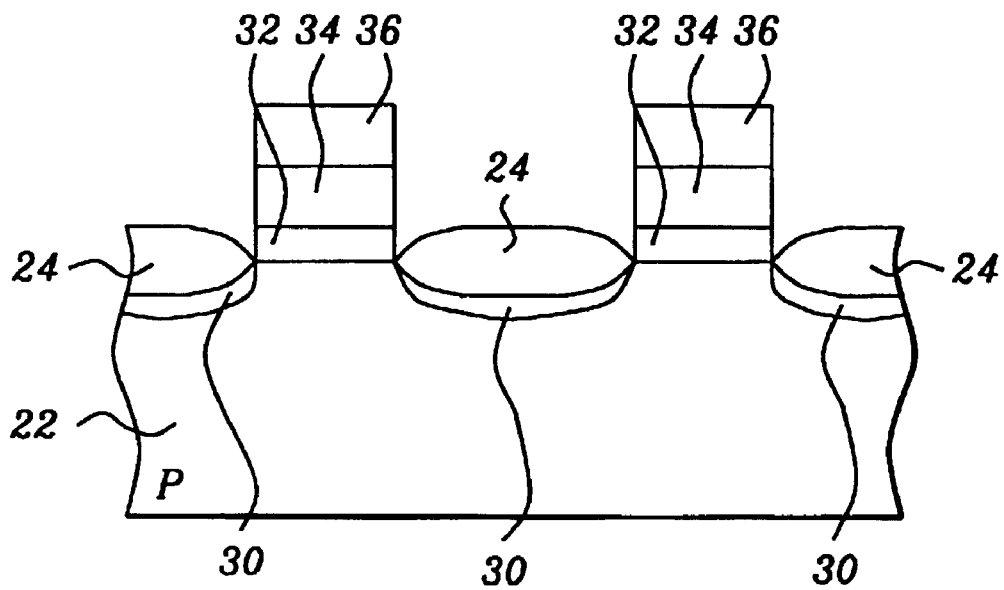
FIG. 4B is a cross section view of a semiconductor device showing the patterned semiconductor device structure after field oxide growth.

FIG. 4B shows the substrate 22 after the field oxide 24 has been thermally grown to a thickness of between 4000 and 6000 Å. After field oxide growth, the photoresist 36, $Si_3N_4$ 34, and pad oxide 32 are removed in preparation for source 28 and drain 26 doping implementation.

Figure 5:
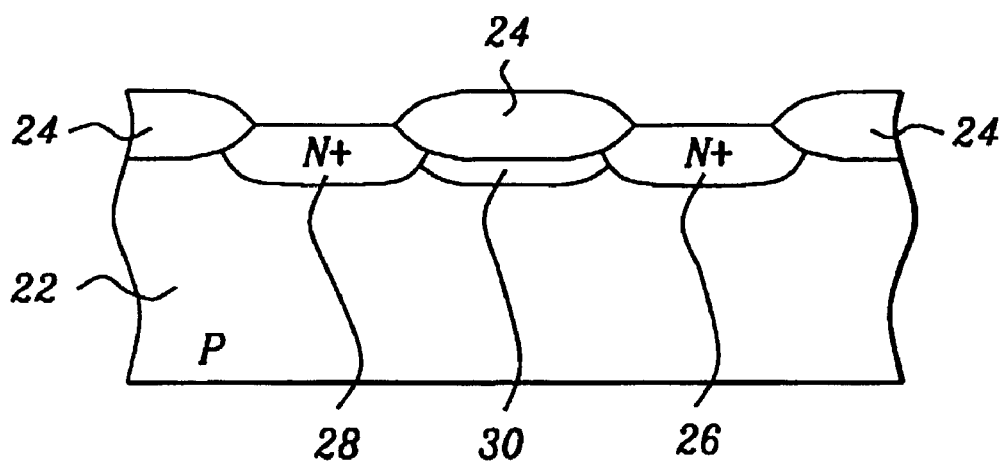
FIG. 5 is a cross section view of a semiconductor device showing the structure after N+ source drain implants.

The source 28/drain 26 doping is performed with a suitable donor element such as phosphorus (P) with an implant dosage level between 1E 15 and 7 E 15 atoms/$cm^2$ and an energy range of between 40 and 80 KeV. This produces the $N^+$ source 28/drain 26 regions as depicted in FIG. 5 with a resultant donor concentration of between 2.5 E18 and 4 E19 atoms/$cm^3$. The process continues with preparation for establishing the conductor system.

Figure 6:
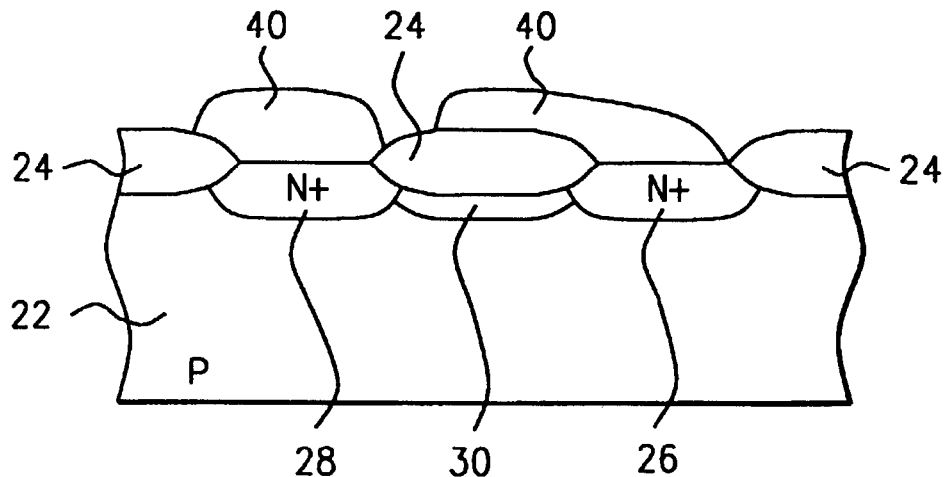
FIG. 6 is a cross section view of a semiconductor device showing one embodiment of the invention using a metal gate thick field oxide FET.

FIG. 6 shows one embodiment of the invention which uses a metal gate structure. Contact surfaces are appropriately cleaned and metal is placed down, followed by the contact metal patterning and removal an unwanted areas. As shown in FIG. 6 a metal 40, typically aluminum (Al), has been deposited over the thick oxide gate region 24 and over the field FET drain region 26 tying those elements together electrically. Although not shown in the figure for clarity, the metal conductor 40 is ultimately connected to the active logic circuits I/O pad. A similar metal element 40 as shown in FIG. 6 is used to connect the FET source region to a second voltage source, typically ground, as indicated in the schematic in FIG. 2.

The FET source conductor 40S is connected to a second voltage, typically ground 16, as represented in the schematic depicted in FIG. 2. Also, these same conductors connect the parasitic transistor base and emitter to the second voltage source and the parasitic collector to the input pad.

Figure 7:
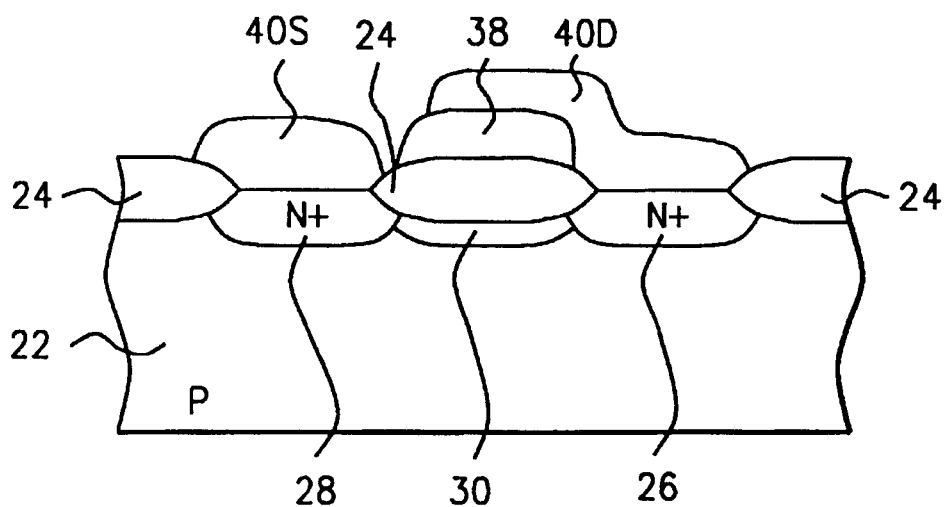
FIG. 7 is a cross section view of a semiconductor device showing an embodiment of the invention using a polysilicon gate thick field oxide FET.

An alternative embodiment of the invention is to use a polysilicon (poly) gate. FIG. 7 depicts a device with a patterned layer of polysilicon 38 deposited on top of the thick field gate oxide 24. The poly deposition is typically a low pressure chemical vapor deposition (LPCVD) done at a temperature between 600 and 800 degrees centigrade (° C.) using silane or a gas stream containing nitrogen ($N_2$) or hydrogen ($H_2$) to a thickness of between 3000 and 4400 Å. The poly deposition is usually done after crowing the thick thermal field oxide and before source drain implant steps and is typically doped with phosphine or other suitable dopant to improve conductivity. The poly becomes a principle part of the gate electrical structure. The polysilicon is removed from unwanted areas on the surface, and $N^{30}$ source/drain implants are applied as previously described.

That is the poly gate FET source/drain (S/D) implant is also done with a phosphorus (P) implant with a dosage level between 1 E15 and 7 E15 a/$cm^2$ and with an energy range of between 40 KeV and 80 KeV to produce the $N^+$ source 28 and drain 26 regions with a resultant donor concentration of between 2.5 E18 and 4 E 19 a/$cm^3$.

Again, a metallization layer 40D, 40S, typically aluminum, is deposited, patterned, and removed where not required to complete the contact system for the FET poly gate and source and drain as shown in FIG. 7. As indicated in FIG. 7 the poly gate is connected to the drain. As shown schematically in FIG. 2, the gate and drain are electrically connected to the active circuit input pad 10, and the source is electrically connected to a second voltage source, typically ground. Normal processing such as covering the surface of the devices with a passivation layer such as borophosphorus silicate glass (BPSG) is continued to complete the manufacturing of the device.

As previously stated, the field implant 30 produces a lightly doped N region in the substrate under the thick field gate oxide which modifies the Vt of the thick field oxide FET. Depending on the dopant level of the field implant the Vt can be changed by over 2 volts. The amount of field implant level can be coordinated with the application requirements, That is, lower voltage applications can have lower ESD protection thresholds with the resulting improved protection benefit, and higher voltage applications call have higher thresholds as required to avoid premature protection device triggering. Also, it can be preferable to use polysilicon gate conductors for the thick field protection device for lower voltage applications and metal gate electrodes for higher voltage applications if desired.

Table 1 shows a representative change in the thick oxide poly gate element Vt. As shown, the average threshold voltage for a thick oxide poly gate device without the field implant is 12.9 volts, whereas a similar device with a n field implant done with a dosage of 1 E12 using an energy level of 60 KeV to produce a resulting concentration of 4 E13 a/$cm^3$ has a Vt of 11.5 volts, a change of 1.4 volts. This reduction in threshold voltage besides more closely matching application requirements is also analogous to allowing 1.5 kV greater ESD pass voltage, a desirable improvement.

TABLE 1

NMOS poly gate thick field device Field Implant Threshold Effect

| | Field Implant Device | No Field Implant Device |
|---|---|---|
| Wafers | 1–9 | 10–12 |
| N-Field Implant | 60KE12 | Not Applicable |
| Threshold Voltage (Vt) | 11.5 Volts | 12.9 Volts |
| Snap Back Voltage | 13.54 Volts | 13.77 Volts |

While the invention has been particularly shown and described with reference to the preferred embodiments thereof, it will be understood by those skilled in the art that various changes in form and details may be made without departing from the spirit and scope of the invention.

What is claimed is:

1. A FET integrated circuit semiconductor device structure with associated lateral parasitic npn bipolar transistor on a semiconductor substrate for the purpose of providing electrostatic voltage discharge protection to the active semiconductor devices on the substrate comprising:

a metal gate element with associated channel region under said gate;

a thick field gate oxide layer insulating said metal gate structure from said FET channel;

an N field region in said channel under entire said metal gate structure region;

a source/drain region in proximity to and on either side of said metal gate element;

an electrical connection system for said metal gate structure and said source/drain regions and said associated parasitic bipolar transistor.

2. The structure according to claim 1 wherein said thick field gate oxide has a thickness between 4000 and 6000 Å.

3. The structure according to claim 1 wherein said thick oxide gate field region has a dopant density of between 4 E13 and 6 E13 a/$cm^3$.

4. The structure according to claim 1 wherein said source drain regions consist of N+ regions within said substrate with a doping density of between 2.5 E18 and 4 E19 a/$cm^3$.

5. The structure according to claim 1 wherein said electrical connection system in said source/drain regions and for said gate element consists of aluminum metallurgy.

6. The structure according to claim 1 wherein the electrical connection for said FET drain is connected to said FET gate and the collector of said bipolar transistor and connected to a first voltage source at the active device input/output pad.

7. The structure according to claim 1 wherein the electrical connection for said FET source is connected to the emitter and base of said parasitic bipolar transistor and connected to a second voltage source or ground.

8. A N-channel thick field oxide FET integrated circuit semiconductor device structure on a semiconductor substrate located outside the active device area for the purpose of providing electrostatic voltage discharge protection to the active semiconductor devices on said substrate comprising:

a polysilicon gate element;

a gate oxide layer insulating said gate element from said channel;

an N field region under said polysilicon gate element region;

a N+ source/drain region in proximity to and on either side of said polysilicon gate element;

an electrical connection structure for said polysilicon gate and source/drain regions;

A parasitic bipolar transistor;

an electrical connection whereby said FET drain is connected to said FET gate and the collector of said bipolar transistor and connected to a first voltage source at said active device input/output pad.

9. The structure according to claim 8 wherein said thick field gate oxide has a thickness between 4000 and 6000 Å.

10. The structure according to claim 8 wherein said thick field oxide gate field region has a dopant density of between 4 E13 and 6 E13 a/cm$^3$.

11. The structure according to claim 8 wherein said source/drain regions consist of N+ regions with a doping density of between 2.5E18 and 4 E19 a/cm$^3$.

12. The structure of claim 8 whereby said polysilicon gate element has a thickness of between 3000 and 4400 Å.

13. The structure according to claim 8 wherein said thick field polysilicon gate electrode connection structure is completed by Aluminum metallurgy.

14. The structure according to claim 8 wherein said electrical connection structure in said source region consists of aluminum metallurgy.

15. The structure according to claim 8 wherein the electrical connection for said FET drain is connected to the emitter and base of said parasitic bipolar transistor and connected to a second voltage source or ground.

* * * * *